United States Patent
Lin et al.

(10) Patent No.: US 9,230,934 B2
(45) Date of Patent: Jan. 5, 2016

(54) SURFACE TREATMENT IN ELECTROLESS PROCESS FOR ADHESION ENHANCEMENT

(71) Applicant: Taiwan Semiconductor Manufacturing Company, Ltd., Hsin-Chu (TW)

(72) Inventors: Jing-Cheng Lin, Hsin-Chu (TW); Cheng-Lin Huang Huang, Hsin-Chu (TW); Wei-An Tsao, Yuanlin Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 54 days.

(21) Appl. No.: 13/897,290

(22) Filed: May 17, 2013

(65) Prior Publication Data

US 2014/0264841 A1 Sep. 18, 2014

Related U.S. Application Data

(60) Provisional application No. 61/794,568, filed on Mar. 15, 2013.

(51) Int. Cl.
*H01L 23/00* (2006.01)
*H01L 23/29* (2006.01)
*H01L 25/065* (2006.01)

(52) U.S. Cl.
CPC .............. *H01L 24/16* (2013.01); *H01L 23/291* (2013.01); *H01L 24/13* (2013.01); *H01L 24/11* (2013.01); *H01L 24/12* (2013.01); *H01L 24/14* (2013.01); *H01L 24/15* (2013.01); *H01L 25/0657* (2013.01); *H01L 2224/03831* (2013.01); *H01L 2224/0401* (2013.01); *H01L 2224/05022* (2013.01); *H01L 2224/05027* (2013.01); *H01L 2224/05147* (2013.01); *H01L 2224/05166* (2013.01); *H01L 2224/05567* (2013.01); *H01L 2224/05572* (2013.01); *H01L 2224/05573* (2013.01); *H01L 2224/05624* (2013.01); *H01L 2224/05647* (2013.01); *H01L 2224/131* (2013.01); *H01L 2224/13018* (2013.01); *H01L 2224/13022* (2013.01); *H01L 2224/13083* (2013.01); *H01L 2224/13084* (2013.01); *H01L 2224/13144* (2013.01); *H01L 2224/13147* (2013.01); *H01L 2224/13155* (2013.01); *H01L 2224/13164* (2013.01); *H01L 2224/16507* (2013.01); *H01L2224/81193* (2013.01); *H01L 2924/1461* (2013.01); *H01L 2924/35121* (2013.01)

(58) Field of Classification Search
CPC .................................................. H01L 23/4885
USPC ........................................... 257/737; 438/754
See application file for complete search history.

(56) References Cited

U.S. PATENT DOCUMENTS

| 5,619,071 A | 4/1997 | Myers et al. |
| 2006/0141762 A1* | 6/2006 | Khandekar et al. ........... 438/622 |
| 2007/0108612 A1* | 5/2007 | Hsieh et al. .................... 257/738 |

(Continued)

FOREIGN PATENT DOCUMENTS

JP 2007258438 A 10/2007

*Primary Examiner* — William Harriston
(74) *Attorney, Agent, or Firm* — Slater & Matsil, L.L.P.

(57) ABSTRACT

An embodiment method of forming and a bump structure are disclosed. The bump structure includes a passivation layer formed over a metal pad, the passivation layer having a recess exposing a portion of the metal pad, and a metal bump formed over the metal pad, the metal bump having a lip extending beneath the passivation layer, the lip anchoring the metal bump to the passivation layer.

20 Claims, 10 Drawing Sheets

(56) References Cited

U.S. PATENT DOCUMENTS

| | | |
|---|---|---|
| 2007/0120269 A1* | 5/2007 | Hsieh et al. .................. 257/778 |
| 2008/0026564 A1* | 1/2008 | Frohberg et al. ............. 438/637 |
| 2008/0230896 A1* | 9/2008 | Zhong et al. .................. 257/737 |
| 2010/0252926 A1 | 10/2010 | Kato et al. |
| 2011/0291262 A1* | 12/2011 | Shen et al. .................... 257/737 |
| 2013/0099330 A1* | 4/2013 | Foster ........................... 257/412 |

\* cited by examiner

SURFACE TREATMENT IN ELECTROLESS PROCESS FOR ADHESION ENHANCEMENT

CROSS-REFERENCE TO RELATED APPLICATIONS

This application claims the benefit of U.S. Provisional Application No. 61/794,568, filed on Mar. 15, 2013, entitled "Surface Treatment in Electroless Process for Adhesion Enhancement," which application is hereby incorporated herein by reference.

BACKGROUND

Flip chip, also known as controlled collapse chip connection or its acronym, C4, is a method for interconnecting semiconductor devices, such as IC chips and microelectromechanical systems (MEMS), to external circuitry with solder bumps that have been deposited onto the chip pads.

The solder bumps are deposited on the chip pads on the top side of the wafer during the final wafer processing step. In order to mount the chip to external circuitry (e.g., a circuit board or another chip or wafer), it is flipped over so that its top side faces down, and aligned so that its pads align with matching pads on the external circuit, and then the solder is flowed to complete the interconnect. This is in contrast to wire bonding, in which the chip is mounted upright and wires are used to interconnect the chip pads to external circuitry.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

The present disclosure will be described with respect to embodiments in a specific context, namely a bump structure for use in creating a bump joint for flip-chip bonding. The concepts in the disclosure may also apply, however, to other integrated circuit structures, joints, or bonding.

Figure 1:
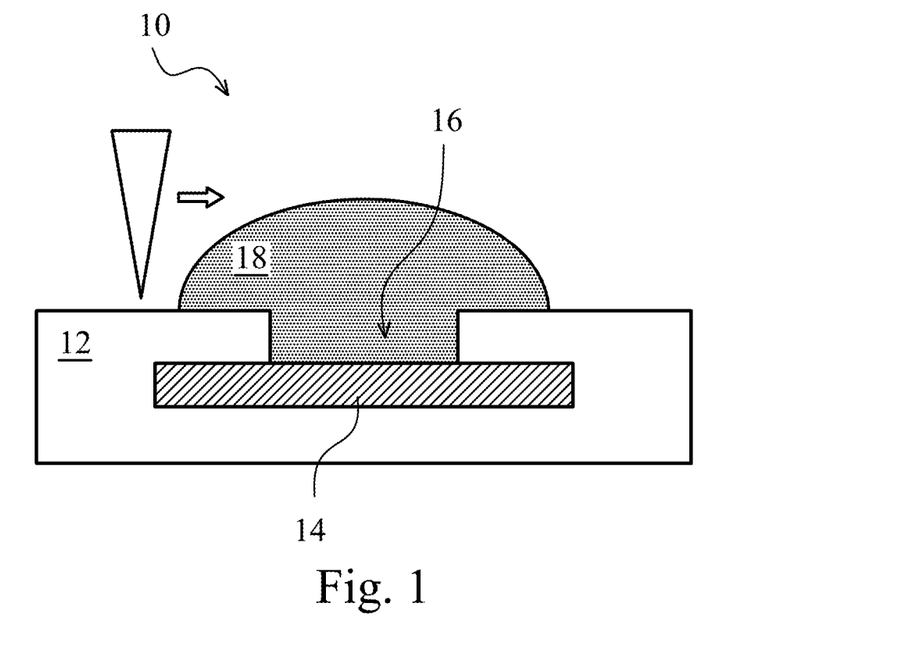
FIG. 1 illustrates a conventional bump structure for reference.

Referring now to FIG. 1, a conventional bump structure 10 is illustrated for reference. The conventional bump structure 10 includes a passivation layer 12 formed over a metal pad 14. As shown, the passivation layer 12 includes a recess 16 permitting a metal bump 18 to be electrically coupled with the metal pad 14. Unfortunately, the conventional bump structure 10 may suffer from relatively low adhesion strength. This low adhesion strength may result in the conventional bump structure 10 having a low shear strength, as represented by the wedge and arrow in FIG. 1. Because of the low adhesion strength and/or the low shear strength, the conventional bump structure 10 of FIG. 1 may have a relatively low mechanical reliability, including when the bump structure 10 is subjected to subsequent processing steps.

Figure 2:
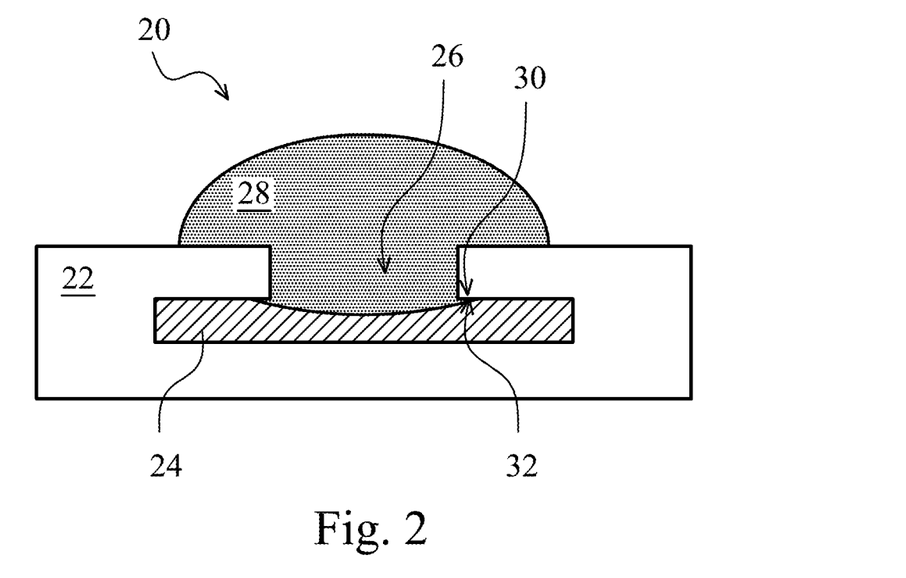
FIG. 2 illustrates an embodiment bump structure having a bump with a lip.

Referring now to FIG. 2, an embodiment bump structure 20 is illustrated for reference. The embodiment bump structure 20 includes a passivation layer 22 formed over a metal pad 24. As shown, the passivation layer 22 includes a recess 26 permitting a metal bump 28 to be electrically coupled with the metal pad 24. As will be more fully explained below, the recess 26 may be formed by removing an upper portion of the metal pad 24.

In an embodiment, the passivation layer 22 is formed from silicon nitride (SiN) or another suitable passivation material. In an embodiment, the metal pad 24 is formed from copper (Cu), aluminum (Al), an alloy of aluminum and copper, or another suitable metal. In an embodiment, the metal bump 28 is formed from Electroless Nickel—Electroless Palladium—Immersion Gold (ENEPIG), Electroless Nickel—Electroless Palladium (ENEP), Electroless Nickel—Immersion Gold (ENIG), or another suitable electroless metal.

Still referring to FIG. 2, an undercut 30 (a.k.a., lateral recess) is disposed between the passivation layer 22 and the metal pad 24. As shown, the undercut 30 is filled by a lip 32 of the metal bump 28. In other words, the lip 32 projects laterally outward in FIG. 1. As such, the lip 32 generally anchors the bump 28 to the rest of the embodiment bump structure 20.

In an embodiment, the lip 32 engages a top surface or ceiling of the undercut 30 in order to prevent the loss of adhesion and to resist shear. Indeed, the lip 32 of the metal bump 28 provides the embodiment bump structure 20 with exceptional adhesion strength and shear strength relative to, for example, the conventional bump structure 10 of FIG. 1.

Figure 3A:
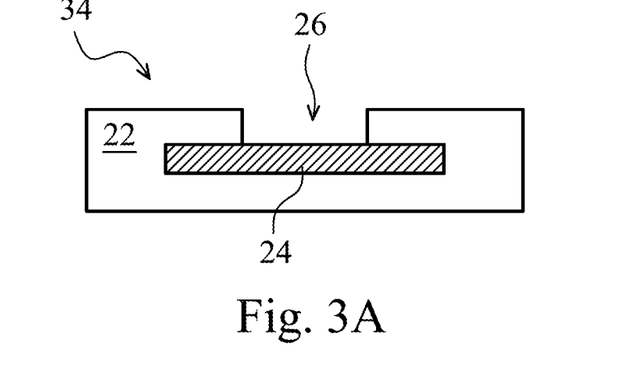
FIGS. 3A-3C collectively illustrate a process of forming the embodiment bump structure of FIG. 2.
Figure 3B:
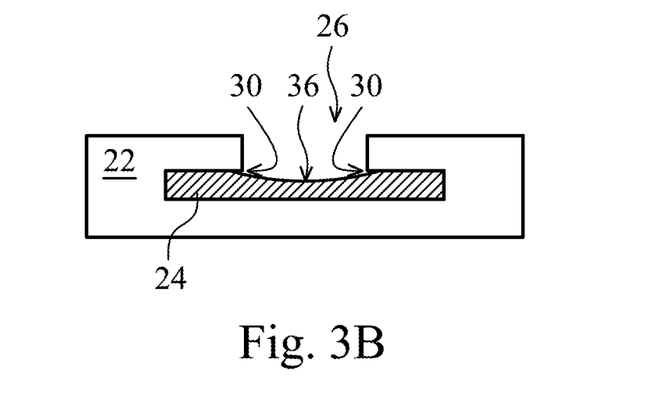
Figure 3C:
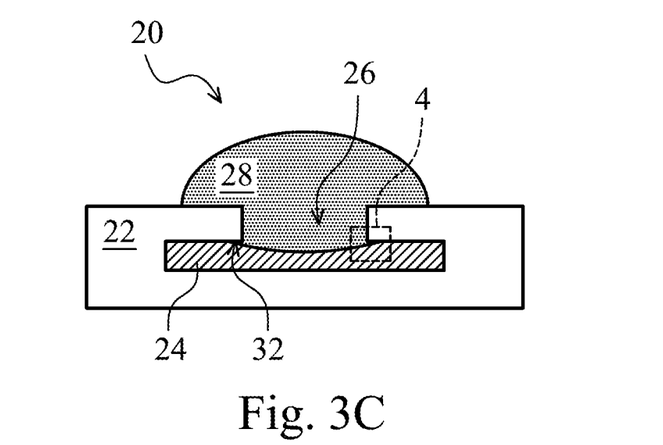

Referring collectively to FIGS. 3A-3C, a process of forming the embodiment bump structure 20 of FIG. 2 is illustrated. In FIG. 3A, the recess 26 has been formed in the passivation layer 22 to expose the metal pad 24 within the incoming wafer 34. In FIG. 3B, a surface treatment is performed to remove an upper portion of the metal pad 24 and to produce the undercut 30. In an embodiment, the surface treatment is a wet etching process.

In an embodiment, the surface treatment utilizes an oxidizer and an oxide remover to form the undercut 30. For example, an upper portion of the metal pad 24 may be oxidized to form a thin layer of metal oxide on the metal pad 24. Thereafter, a suitable oxide remover may be chosen to remove all or a suitable portion of the thin layer of metal oxide. By removing the thin layer of metal oxide from the metal pad 24, the undercut 30 is formed.

In an embodiment, after removal of the thin layer of metal oxide from the metal pad 24 a portion of the top surface 36 of the metal pad 24 has a generally concave shape. In other words, when viewed from the side as in FIG. 3B, the top surface 36 of the metal pad 24 is arcuate or rounded. In an embodiment, the top surface 36 of the metal pad 24 may be generally planar or have another suitable shape and still permit the undercut 30 to be formed.

In FIG. 3C, the bump 28 is formed over the metal pad 24 to form the embodiment bump structure 20. As shown in FIG. 3C, the lip 32 of the bump 28 extends into and occupies the undercut 30. In other words, the lip 32 anchors the bump 28 within the embodiment bump structure 20.

Figure 4:
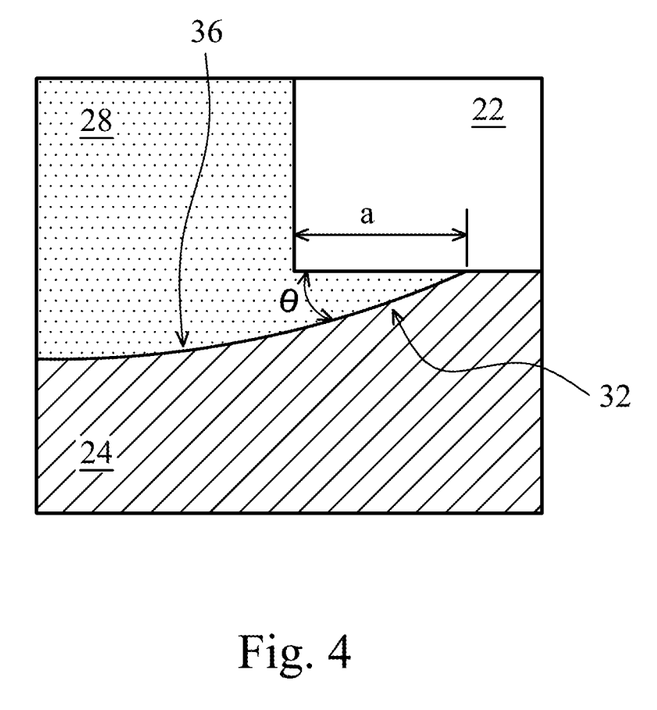
FIG. 4 illustrates a cut away portion of the embodiment bump structure of FIG. 2 highlighting parameters of the lip.

Referring now to FIG. 4, a cut-away portion of the bump structure 20 of FIG. 3C is provided. The lip 32 may have a recess depth, a. As shown, the recess depth, a, is generally measured from a sidewall of the passivation layer 22 and/or the sidewall of the bump 28 to a distal end of the lip 32. In an embodiment, the recess depth, a, is greater than about zero micrometers (0 μm). The lip 32 may also define an angle, θ. As shown, the angle, θ, is measured from the top surface or ceiling of the lip 32 to the top surface 36 of the metal pad 24. In an embodiment, the angle, θ, is greater than about zero degrees. While the lip 32 in FIG. 4 is generally triangular in cross-sectional shape, it should be recognized that the lip 32 may resemble other shapes (e.g., rectangle, square, etc.) in other embodiments.

Figure 5A:
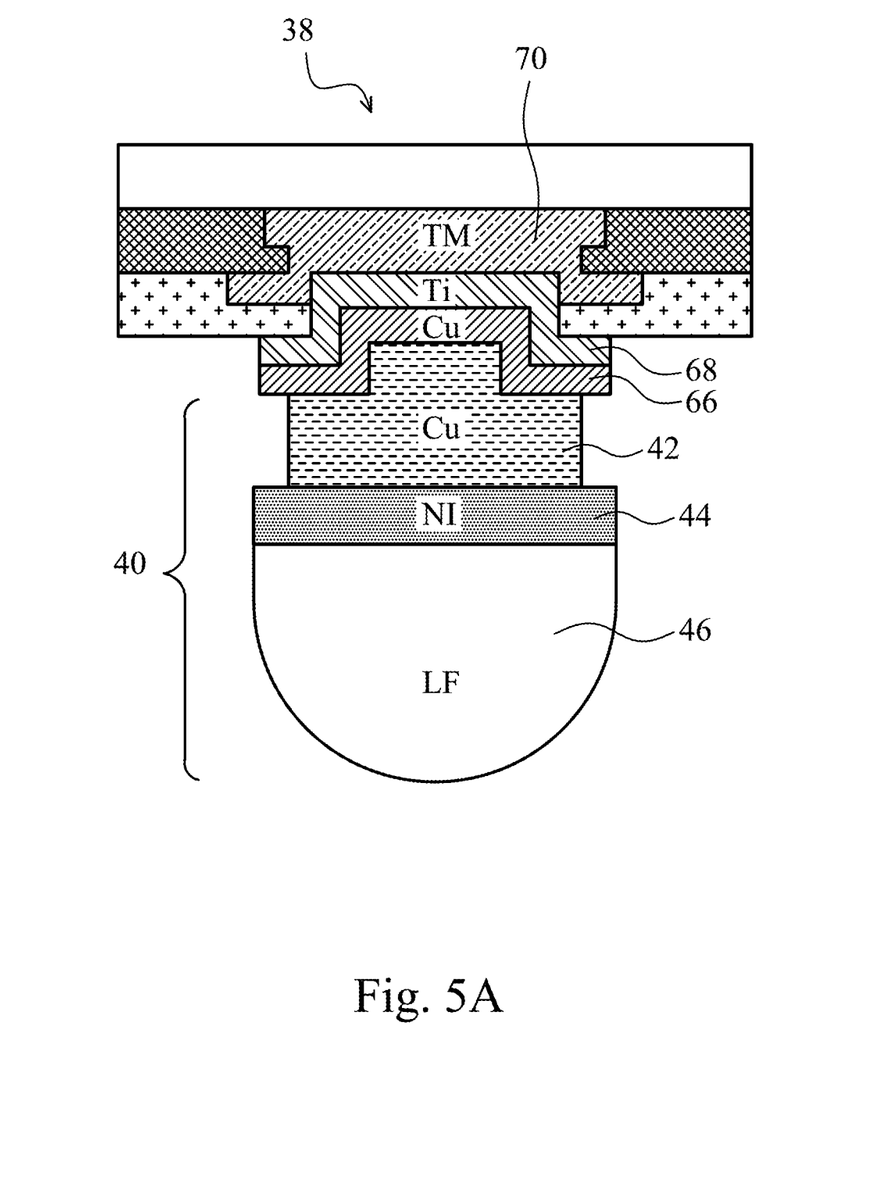
FIGS. 5A-5C illustrate top dies that may be used to form a bump joint with a bottom die.
Figure 5B:
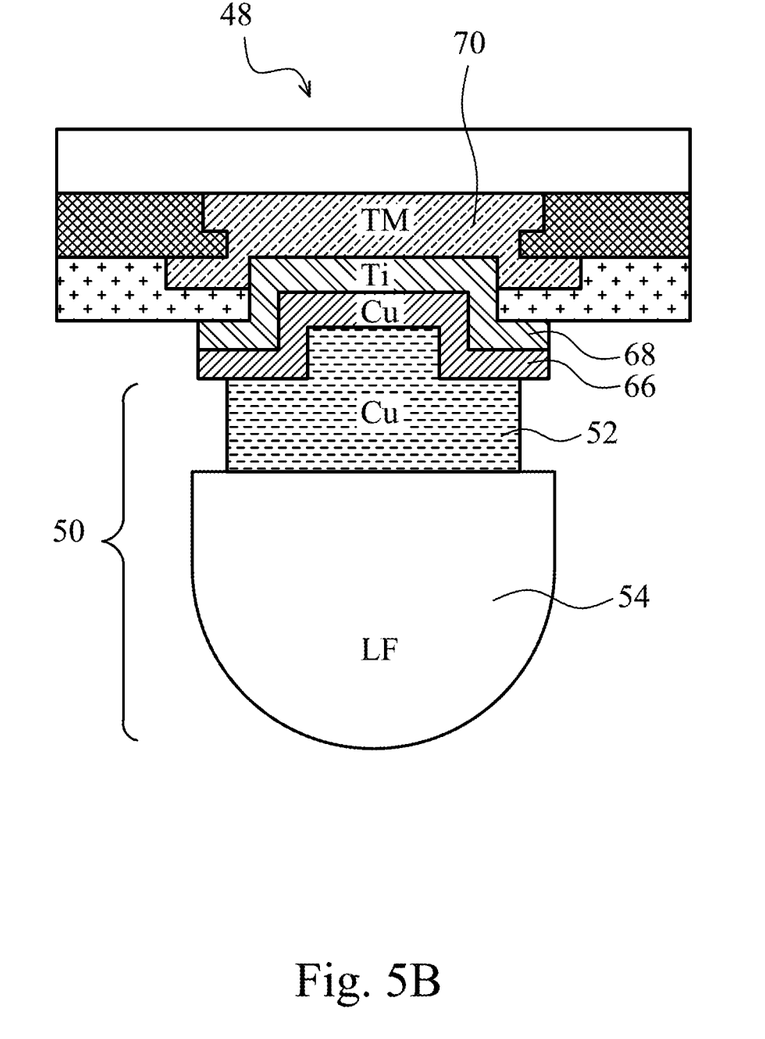
Figure 5C:
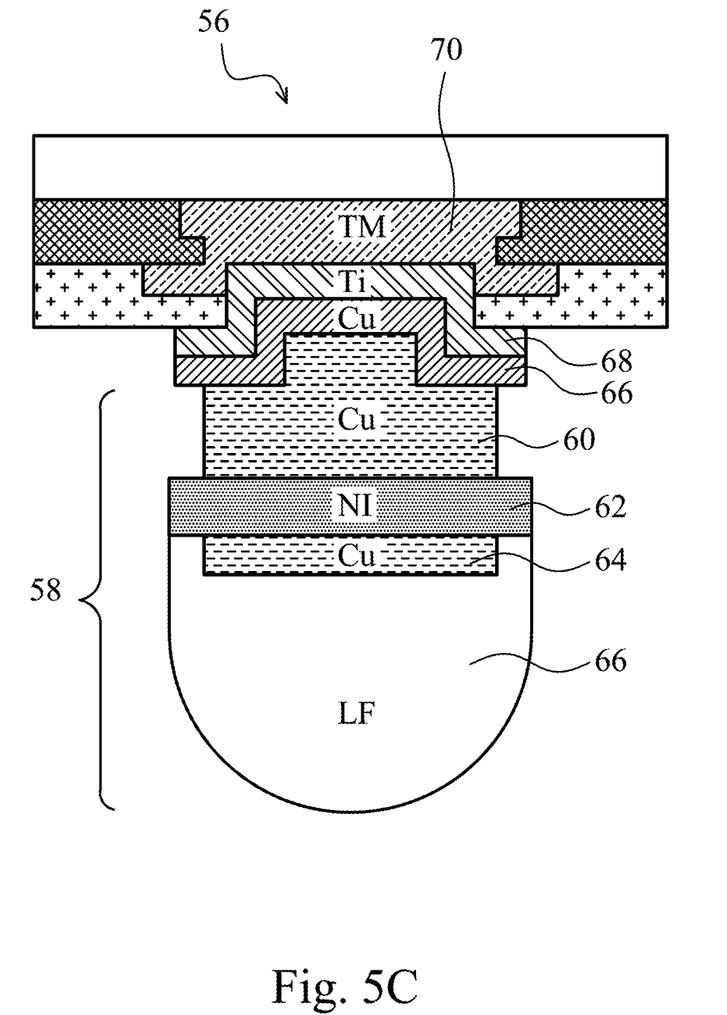

Referring now to FIGS. 5A-5C, top dies that may be used to form a bump joint with a bottom die are illustrated. In FIG. 5A, a top die 38 supports bump structure 40. As shown, the bump structure 40 includes a copper pillar 42, a nickel layer 44, and a lead-free solder bump 46. In FIG. 5B, a top die 48 supports bump structure 50. As shown, the bump structure 50 includes a copper pillar 52 and a lead-free solder bump 54. In FIG. 5C, a top die 56 supports bump structure 58. As shown, the bump structure 58 includes a copper pillar 60, a nickel layer 62, and a copper layer 64 embedded in a lead-free solder 66. As shown in FIGS. 5A-5C, the top dies 38, 48, 56 may also include other layers and structures such as a copper layer 68, a titanium layer 70, a top metal layer 72, and so on.

Figure 6A:
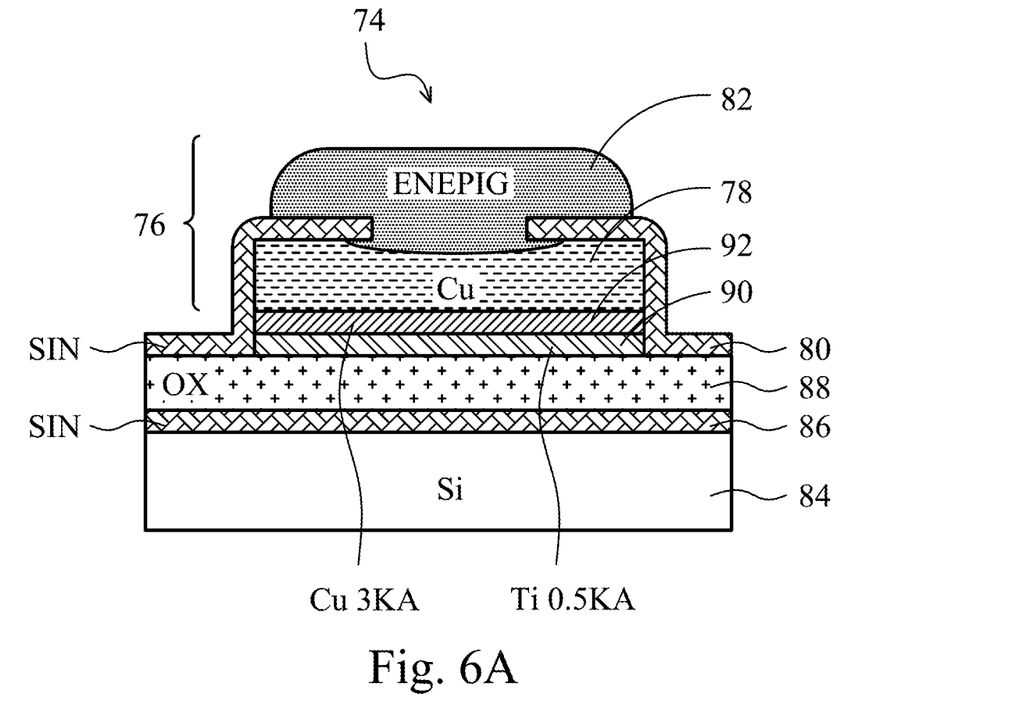
FIGS. 6A-6B illustrate bottom dies incorporating an embodiment bump structure having a lip that may be used to form a bump joint with a top die.
Figure 6B:
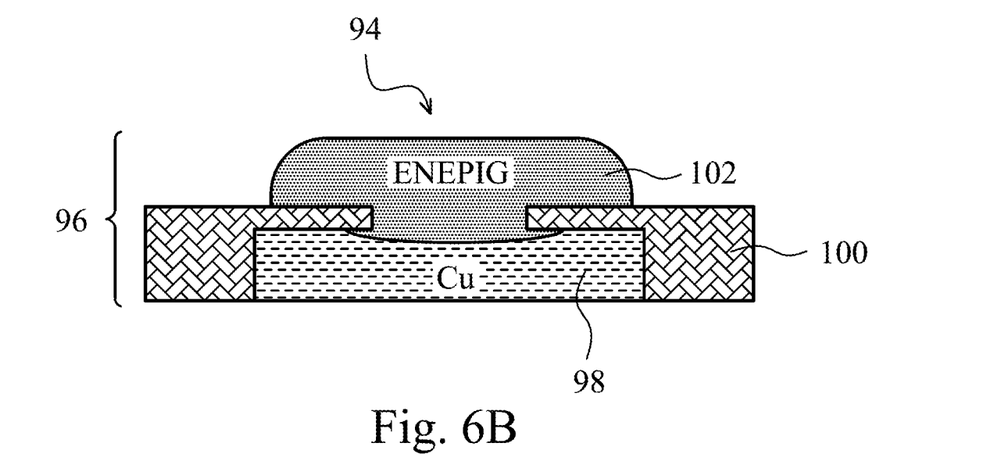

Referring now to FIGS. 6A-6B, bottom dies incorporating an embodiment bump structure having a lip that may be used to form a bump joint with a top die are illustrated. In FIG. 6A, a bottom die 74 includes a bump structure 76. The bump structure 76 is formed from a metal pad 78, a portion of a silicon nitride (SiN) layer 80, and a bump 82 having a lip extending beneath the silicon nitride layer 80. In an embodiment, the bottom die 74 also includes a silicon layer 84, a silicon nitride layer 86, and a buried oxide layer 88. A titanium layer 90, a copper layer 92, and the copper layer 78 are supported by the buried oxide layer 88.

In FIG. 6B, a bottom die 94 includes bump structure 96. The bump structure 96 includes a metal pad 98, a silicon nitride layer 100, and a bump 102. As will be more fully explained below, one of the top dies 38, 48, 56 may be mounted to one of the bottom dies 74, 94 in order to form a bump joints with good adhesion and resistance to shear.

Figure 7A:
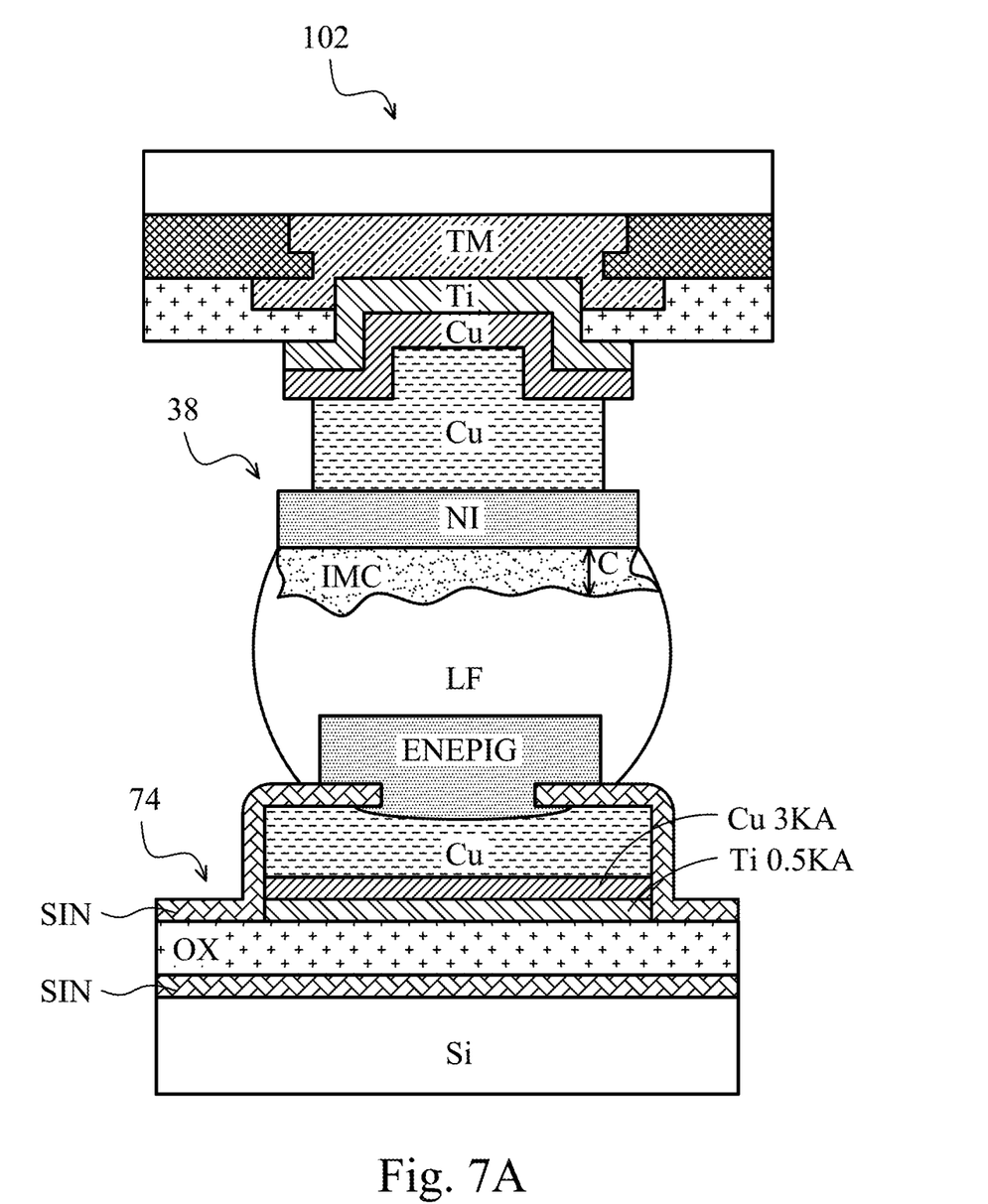
FIGS. 7A-7C illustrate bump joints benefiting from an embodiment bump structure having a lip.
Figure 7B:
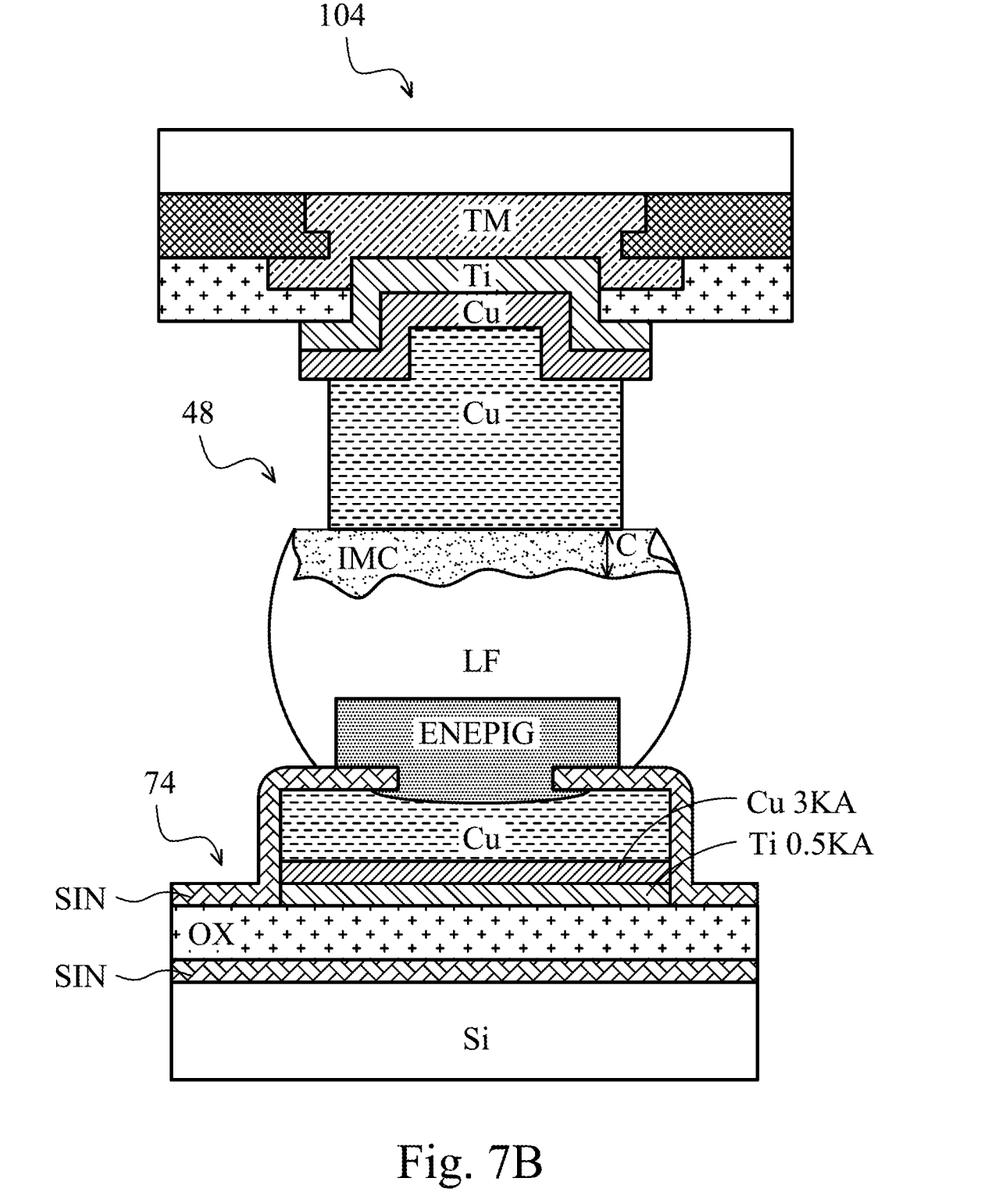
Figure 7C:
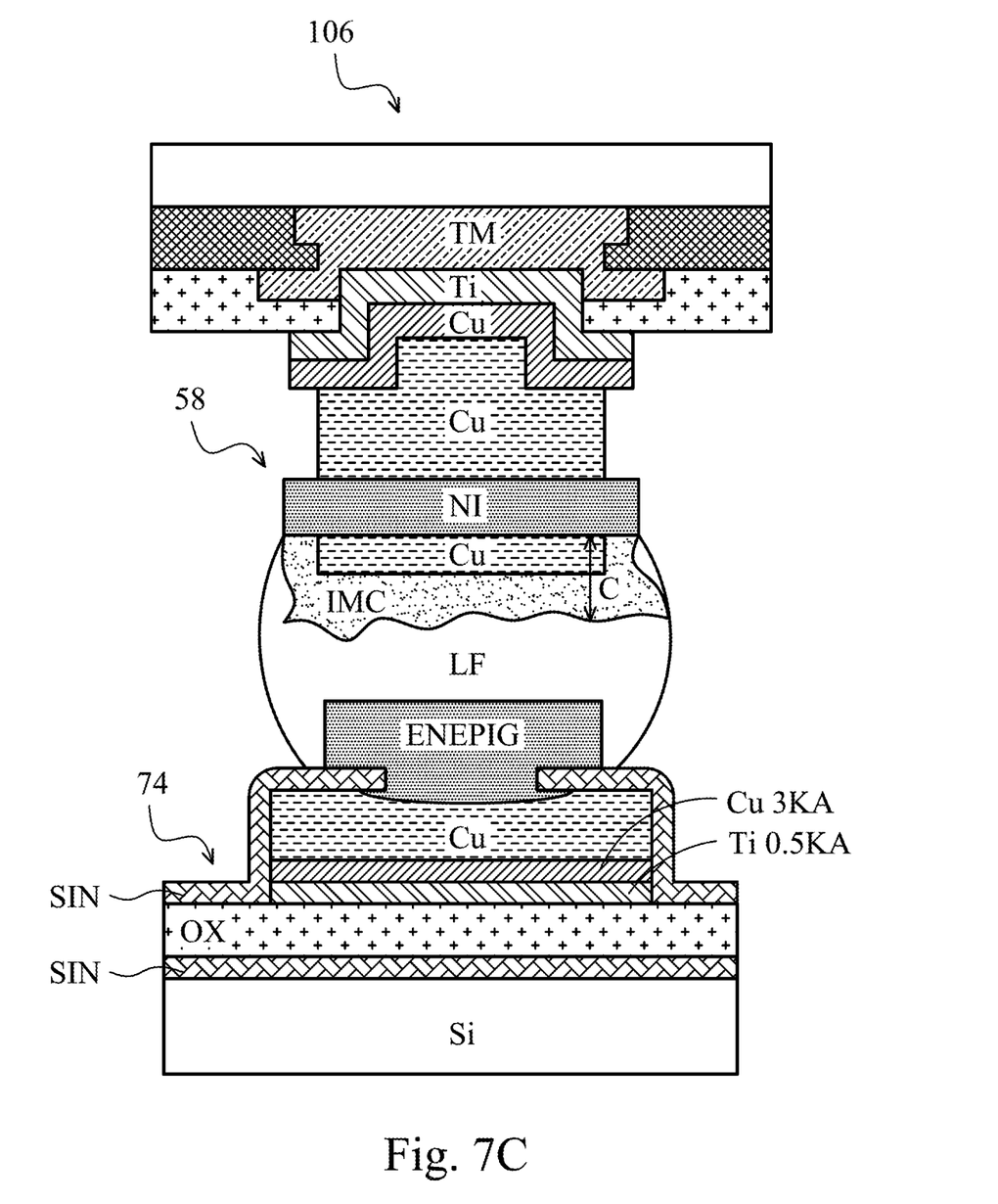

Referring now to FIGS. 7A-7C, bump joints 104, 106, 108 formed from the top dies 38, 48, 56 and the bottom die 74, which all benefiting from an embodiment bump structure having the lip, are illustrated. As shown in FIGS. 7A-7C, the bump joints 102, 104, 106 include an inter-metallic compound (IMC) 110. In an embodiment, the IMC 110 has a thickness, c, of between about one micrometer (1 μm) to about five micrometers (5 μm). In an embodiment, the IMC 110 is a copper/nickel solder interface.

From the foregoing it should be recognized that the bump structure with a lip provides improved adhesion strength with the passivation layer an high shear resistance for electroless metal formation on several kinds of pre-layer metal substrates (e.g., metal pads).

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A structure comprising:
    a first integrated circuit die comprising:
        a metal pad,
        a passivation layer formed on the metal pad, the passivation layer having a recess exposing a portion of the metal pad, and
        a metal bump formed on the metal pad and through the recess, the metal bump having a lip extending laterally beneath a lowermost surface of the passivation layer, the lip anchoring the metal bump to the passivation layer;
    a second integrated circuit die comprising a bump structure; and
    a solder joint joining the metal bump and the bump structure, an intermetallic compound (IMC) being in the solder joint adjoining the bump structure, the IMC having a thickness in a range from 1 μm to 5 μm.

2. The structure of claim 1, wherein the lip has a recess depth measured from a sidewall of the passivation layer to a distal end of the lip, the recess depth greater than about zero micrometers.

3. The structure of claim 1, wherein the passivation layer comprises a silicon nitride.

4. The structure of claim 1, wherein the metal bump comprises one of Electroless Nickel—Electroless Palladium—Immersion Gold (ENEPIG), Electroless Nickel—Electroless Palladium (ENEP), and Electroless Nickel—Immersion Gold (ENIG).

5. The structure of claim 1, wherein the metal pad comprises copper (Cu), aluminum (Al), an alloy of aluminum and copper.

6. The structure of claim 1, wherein the lip has a triangular shape when viewed in cross section.

7. The structure of claim 1, wherein the metal pad has a recess, the recess extending below the passivation layer, wherein the metal bump is positioned in the recess.

8. The structure of claim 1, wherein the bump structure comprises a metal pillar, the IMC directly adjoining the metal pillar.

9. The structure of claim 1, wherein the bump structure comprises a metal pillar and a metal layer on the metal pillar, a material of the metal pillar being different from a material of the metal layer, the IMC directly adjoining the metal layer.

10. The structure of claim 1, wherein the bump structure comprises a metal pillar, a first metal layer on the metal pillar, and a second metal layer on the first metal layer, a material of the metal pillar being different from a material of the first metal layer, the material of the metal pillar being different from a material of the second metal layer, the IMC directly adjoining the second metal layer.

11. A structure, comprising:
    a top die including a first bump structure;
    a bottom die mounted to the top die, the bottom die including a second bump structure having a metal bump with a lip extending laterally beneath a lowermost surface of a passivation layer, the lip anchoring the metal bump to the passivation layer; and
    a solder joint joining the first bump structure to the metal bump, an inter-metallic compound being within the solder joint, wherein the inter-metallic compound has a thickness of between about one micrometer (1 μm) to about five micrometers (5 μm).

12. The structure of claim 11, wherein the metal bump comprises one of Electroless Nickel—Electroless Palladium—Immersion Gold (ENEPIG), Electroless Nickel—Electroless Palladium (ENEP), and Electroless Nickel—Immersion Gold (ENIG).

13. The structure of claim 11, wherein the lip has a triangular shape when viewed in cross section.

14. The structure of claim 11, wherein the metal bump extends into a recess of an underlying metal pad.

15. The structure of claim 11, wherein second bump structure includes a metal pad underlying the metal bump, the metal pad having a recess extending under the passivation layer.

16. A method comprising:
    forming a recess in a passivation layer to expose a metal pad on a first integrated circuit die;
    performing a surface treatment on the metal pad to form an undercut beneath the passivation layer;
    forming a bump on the metal pad, the bump having a lip projecting into the undercut; and
    attaching the bump on the first integrated circuit die to a bump structure on a second integrated circuit die using a solder joint, the solder joint including an intermetallic compound (IMC) adjoining the bump structure, the IMC having a thickness in a range from 1 μm to 5 μm.

17. The method of claim 16, wherein the surface treatment comprises a wet etching process.

18. The method of claim 16, wherein the surface treatment comprises forming a metal oxide on the metal pad and then removing the metal oxide.

19. The method of claim 16, wherein the surface treatment comprises removing a portion of the metal pad.

20. The method of claim 16, wherein the metal pad has a concave top surface after the surface treatment.

* * * * *